(12) United States Patent
Eklund et al.

(10) Patent No.: US 12,135,498 B2
(45) Date of Patent: Nov. 5, 2024

(54) DEVICE AND METHOD FOR ENABLING DERIVING OF CORRECTED DIGITAL PATTERN DESCRIPTIONS

(71) Applicant: Mycronic AB, Taby (SE)

(72) Inventors: Robert Eklund, Stockholm (SE); Gleb Lobov, Sundbyberg (SE); Romain Roux, Saint Egreve (FR)

(73) Assignee: Mycronic AB, Taby (SE)

( * ) Notice: Subject to any disclaimer, the term of this patent is extended or adjusted under 35 U.S.C. 154(b) by 595 days.

(21) Appl. No.: 17/470,390

(22) Filed: Sep. 9, 2021

(65) Prior Publication Data
US 2023/0075473 A1    Mar. 9, 2023

(51) Int. Cl.
*G03F 1/38*    (2012.01)
*G03F 7/00*    (2006.01)
(Continued)

(52) U.S. Cl.
CPC ............ *G03F 1/38* (2013.01); *G03F 7/0002* (2013.01); *G06N 3/04* (2013.01); *G06N 3/063* (2013.01); *G06N 3/08* (2013.01)

(58) Field of Classification Search
CPC ............ G03F 1/38; G03F 7/0002; G03F 1/70; G06N 3/04; G06N 3/063; G06N 3/08; G06N 3/0464; G06N 3/092
See application file for complete search history.

(56) References Cited

U.S. PATENT DOCUMENTS

| | | | |
|---|---|---|---|
| 2002/0086218 A1* | 7/2002 | Tejnil | G03F 1/30 430/22 |
| 2007/0186206 A1* | 8/2007 | Abrams | G03F 1/36 716/54 |

(Continued)

FOREIGN PATENT DOCUMENTS

WO    WO-2019162346 A1 *    8/2019    ............ G03F 1/36

OTHER PUBLICATIONS

A. Baranwal et al. 'Five deep learning recipes for the mask making industry' *Center for Deep Learning Electronics Manufacturing*, 2019, pp. 1-33.
(Continued)

*Primary Examiner* — Stacy Whitmore
(74) *Attorney, Agent, or Firm* — Harness, Dickey & Pierce, P.L.C.

(57) ABSTRACT

Methods, a non-transitory computer-readable storage medium, devices, and a system in relation to training a convolutional neural network for deriving corrected digital pattern descriptions from digital pattern descriptions for use in a process for producing photomasks are disclosed. A reinforcement learning agent is trained to derive corrected digital pattern descriptions from respective digital pattern descriptions. The training is based on a first plurality of generated digital pattern descriptions and an obtained physical model using which predicted binary patterns of photomasks can be derived that would result from inputting digital pattern descriptions to the process for producing photomasks. A second plurality of digital pattern descriptions is then generated, and corresponding corrected digital pattern descriptions are generated using the trained reinforcement learning agent, thereby generating training data. The training data can be used to train a convolutional neural network to derive corrected digital pattern descriptions from digital pattern descriptions, the trained neural network can be used to derive a corrected digital pattern description, and the corrected digital pattern description can be used to produce a photomask according to the corrected digital pattern description.

12 Claims, 5 Drawing Sheets

(51) Int. Cl.
  *G06N 3/04* (2023.01)
  *G06N 3/063* (2023.01)
  *G06N 3/08* (2023.01)

(56) References Cited

U.S. PATENT DOCUMENTS

| | | | |
|---|---|---|---|
| 2014/0272685 A1* | 9/2014 | Sandstrom | G03F 7/70466 430/5 |
| 2020/0278604 A1 | 9/2020 | Lo et al. | |
| 2021/0073972 A1* | 3/2021 | Wu | G06N 3/08 |
| 2021/0201526 A1* | 7/2021 | Moloney | G06N 3/045 |
| 2021/0232865 A1* | 7/2021 | Munoz Delgado | G06V 10/82 |
| 2021/0342651 A1* | 11/2021 | Shibahara | G06F 16/906 |
| 2023/0100578 A1* | 3/2023 | Cao | G03F 7/70441 716/53 |
| 2024/0004305 A1* | 1/2024 | Tao | G03F 7/70283 |

OTHER PUBLICATIONS

L. Pang et al. 'How GPU-accelerated simulation enables applied deep learning for masks and wafers' *Proceedings of SPIE*, SPIEDigitalLibrary.org/conference-proceedings-of-spie, vol. 11178, 2019, pp. 111780A-1-111780A-10.

A. Zepka et al. 'The choice of input data and its impact on a deep learning mask model' *Society of Photo-Optical Instrumentation Engineers* (*SPIE*), 2020, pp. 1-8.

\* cited by examiner

300

400

DEVICE AND METHOD FOR ENABLING DERIVING OF CORRECTED DIGITAL PATTERN DESCRIPTIONS

TECHNICAL FIELD

The present disclosure relates to the area of pattern generation, and in particular to deriving corrected digital pattern descriptions from digital pattern descriptions for use in a process for producing photomasks having binary patterns according to the digital binary pattern descriptions.

BACKGROUND

In the area of pattern generation, such as in photomask generation where a photomask is exposed and processed in a process for producing photomasks, a desired digital pattern of a photomask to be produced may be expressed in a digital pattern description inputted to the process for producing photomasks. A problem with prior art pattern generation is that a resulting binary pattern of a photomask produced in the process for producing photomasks often differs from the desired binary pattern represented by the digital pattern description based on which the photomask is produced. For example, a binary pattern of a produced photomask may differ from desired binary pattern represented by the digital pattern description from which the photomask has been produced in that corners which were not rounded in the digital pattern description are rounded in the binary pattern of the produced photomask.

SUMMARY

Methods, a non-transitory computer-readable storage medium, devices and a system are provided according to the appended claims.

Training data for training a convolutional neural network for deriving corrected digital pattern descriptions from digital pattern descriptions are generated. Each corrected digital pattern description represents a respective desired pattern of a photomask to be produced in a subsequent process for producing photomasks according to digital pattern descriptions. A first plurality of digital pattern descriptions is generated representative of photomasks to be produced in the process for producing photomasks. A physical model is further obtained, e.g. from a preceding process. Using the physical model, a predicted binary pattern can be derived from a given digital pattern description, wherein the predicted binary pattern is a prediction of a binary pattern that would result from inputting the given digital pattern description to the process for producing photomasks. A reinforcement learning agent is then trained to derive corrected digital pattern descriptions from respective digital pattern descriptions. For each digital pattern description of the first plurality of digital pattern descriptions, the training comprises iteratively updating a current candidate corrected digital pattern description using a reward function (or loss function) based on a similarity between a predicted binary pattern of a photomask derived from a current candidate corrected digital pattern description using the physical model and a desired binary pattern represented by the digital pattern description. The training further comprises updating the reinforcement learning agent. A second plurality of digital pattern descriptions is then generated representative of binary patterns of photomasks to be produced in the process for producing photomasks, and corresponding corrected digital pattern descriptions are generated using the trained reinforcement learning agent. The digital pattern descriptions of the second plurality of digital pattern descriptions and corresponding corrected digital pattern descriptions then constitute the generated training data.

The training data may then be used to generate a trained convolutional neural network for deriving corrected digital pattern descriptions from digital pattern descriptions for use in a process for producing photomasks according to the digital pattern descriptions.

The trained convolutional neural network may then be used to derive a corrected digital pattern description from a given digital pattern description for use in a process for producing a photomask according to the given digital pattern description.

The corrected digital pattern description may then be used to produce a photomask according to a given digital pattern description.

BRIEF DESCRIPTION OF THE DRAWINGS

Examples will be described below with reference to the accompanying drawings in which.

All the figures are schematic and generally only show parts which are necessary in order to elucidate the respective examples, whereas other parts may be omitted or merely suggested.

DETAILED DESCRIPTION

Figure 1A:
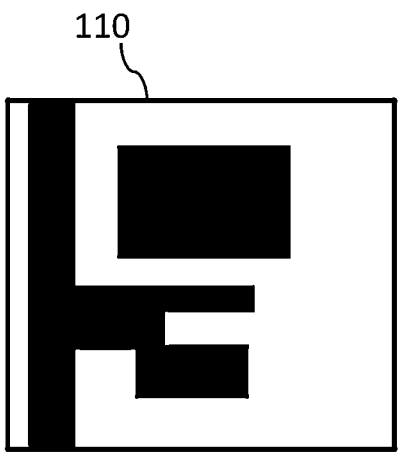
FIGS. 1a and 1b shows an example of a pattern description and a resulting photomask, respectively.
Figure 1B:
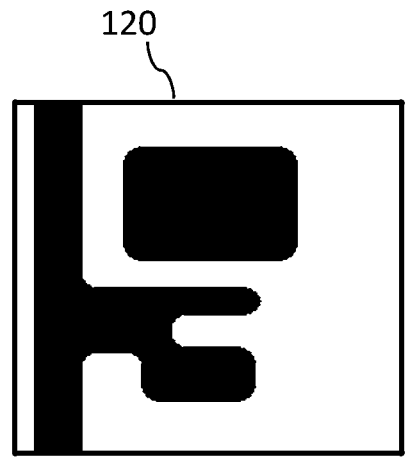

The methods, non-transitory computer-readable storage mediums, devices, and system of the present disclosure may advantageously be implemented in relation to pattern generation, such as in photomask generation where a photomask is exposed and processed. A photomask to be generated is typically expressed in a digital pattern description which is then input to a process for producing a photomask according to the digital pattern description. The digital pattern description is a representation of a desired binary pattern and a binary pattern of a photomask produced in the process for producing photomask according to the digital pattern description should preferably differ as little as possible from the desired binary pattern. An example of such a digital pattern description 110 is shown in FIG. 1a. A problem in photomask generation is that a photomask resulting from a digital pattern description will differ from the digital pattern description. This is due to various physical phenomena in the devices and processes used for generating the photomasks. Examples of such differences (corruptions) can for example be seen in the photomask 120 in FIG. 1*b* resulting from the digital pattern description 110 in FIG. 1*b*. The photomask 120 in FIG. 1*b* exhibits corner rounding, i.e. sharp corners in the digital pattern description 110 in FIG. 1*a* are rounded in the resulting photomask 120 in FIG. 1*b*. Other differences may also occur not shown in FIGS. 1*a* and 1*b*. For example, for features close to resolution limit the linewidth may drop off. Furthermore, the linewidth or the distance between lines may vary depending on the near surrounding. These types of linearity errors may be referred to as the proximity effects.

Figure 2:
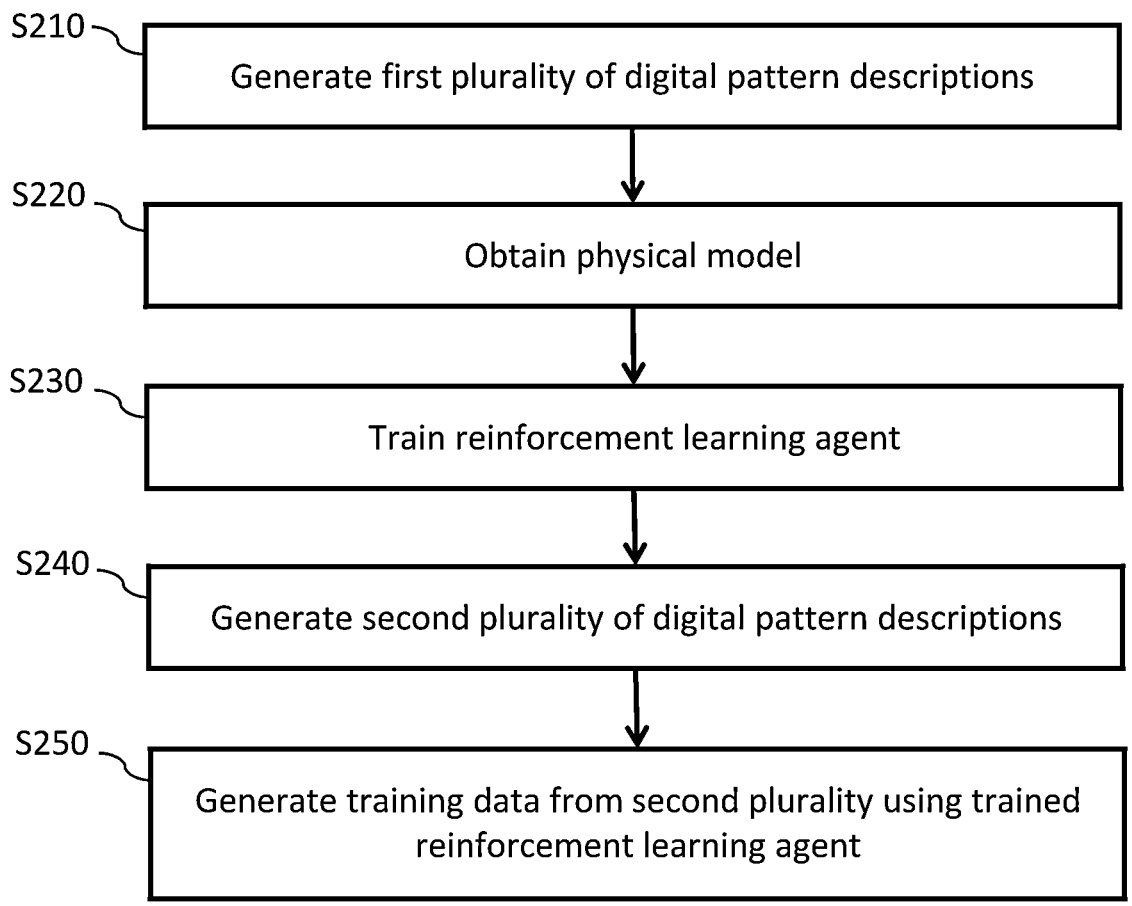
FIG. 2 shows a flow chart of a method according to the present disclosure.

FIG. 2 shows a flow chart of a method 200 for generating training data for training a convolutional neural network for deriving corrected digital pattern descriptions from digital pattern descriptions for use in a process for producing photomasks according to the digital pattern descriptions. Each digital pattern description represents a respective desired pattern of a photomask to be produced in the process for producing photomasks.

The digital pattern descriptions are rasterized descriptions of the desired binary patterns. A digital pattern description may be a translation of a desired binary pattern into a form which can be used to produce a photomask in the process for producing photomasks. Each digital pattern description and corrected digital pattern description may be defined using such a rasterized description as a grid of pixels, wherein each pixel has respective value. The value may be binary, i.e. each pixel may have one of two values. However, if the digital pattern description is a translation into a form which can be used to produce a photomask in the process for producing photomasks, this requires that the photomask to be generated only requires digital pattern descriptions and corrected digital pattern descriptions that can be defined using whole pixel sizes. For photomasks to be generated that require that the digital pattern descriptions and corrected digital pattern descriptions are defined using also fractions of a pixel size, the values have to be able to express such fractions. For a process for producing photomasks using exposure of a radiation sensitive surface by means of a radiation beam, the value may represent an intensity of the radiation beam in relation to the pixel. The value may represent any other parameter, such as time of radiation, or combination of parameters, for achieving a desired radiation dosage for the pixel to achieve a desired coverage of the pixel as defined by the desired binary pattern. For example, for a process for producing a photomask by means of a lithographic laser writer, writing a fraction of a pixel size may be achieved by reducing laser intensity to a fraction of the intensity used to writing a whole pixel. Such reduction of laser intensity may for example be used to adjust an edge position of a pattern with a fraction of the pixel size. Notwithstanding any edge blur, the resulting photomask will have a binary pattern, albeit with a higher resolution than the pixel resolution of the grid of pixels.

Generally, the resolution of the rasterized description is not limited to the resolution of a resolution used in the process for producing photomasks. A higher or lower resolution may also be used. In such a case a translation of a resulting corrected digital pattern description into a resolution is required before use in the process for producing photomasks. Use of higher resolution rasterized digital pattern descriptions is for example advantageous for producing corrected digital pattern descriptions in relation to small corruptions in a photomask.

The method comprises generating S210 a first plurality of digital pattern descriptions representing desired binary patterns representative of desired binary patterns of photomasks to be produced using the process for producing photomasks.

By representative is meant that the desired binary patterns represented by the first plurality of digital pattern descriptions are at least of a same general type as the desired binary patterns of photomasks to be produced in the process for producing photomasks.

It is to be noted that the first plurality of digital pattern descriptions need not include digital pattern descriptions corresponding to complete desired binary patterns of photomasks to be produced using the process for producing photomasks. Instead, the plurality of digital pattern descriptions may be representative of desired binary patterns in that it includes digital pattern descriptions representing portions (crops) of desired binary patterns of photomasks to be produced using the process for producing photomasks.

Each digital pattern description of the first plurality of digital pattern descriptions may be randomly generated. For example, the random generation of a digital pattern description may comprise randomly adding and/or removing elements starting from an initial empty digital pattern description or seed digital pattern description. The type of elements added and/or removed will depend on the type of elements included digital pattern descriptions representative of desired binary patterns of photomasks to be produced using the process for producing photomasks. For example, the elements may be rectangles. In such a case, rectangles of random shape, position, and orientation are added and/or removed, e.g. over a predetermined number of iterations.

Generating the first plurality of digital pattern descriptions randomly is a simple way of generating a very large number of varying digital pattern descriptions can be generated.

The method further comprises obtaining S220 a physical model. Using the physical model, a predicted binary pattern of a photomask can be derived from a given digital pattern description, wherein the predicted binary pattern is a prediction of a binary pattern that would result from inputting the given digital pattern descriptions to the process for producing photomasks.

The physical model is a model that uses a digital pattern description and predict the resulting binary pattern of a photomask produced in the process for producing photomasks using that digital pattern description as an input. The physical model may be derived in a preceding process where a plurality of digital pattern descriptions representing binary patterns representative of desired digital pattern descriptions that are to be produced in the process for producing photomasks are first generated. The plurality of digital pattern descriptions is then input to the process for producing photomasks and the resulting binary patterns are used together with the plurality of digital pattern descriptions to derive the physical model. The physical model is typically defined by a set of parameters and the parameters are determined based on comparison of measurements of the resulting binary patterns with the desired binary patterns of the plurality of digital pattern descriptions.

Commonly, a physical model consists of one or more convolutions in order to low pass filter the digital pattern description to mimic a result on a photomask produced in the process for producing photomasks using the digital pattern description as an input. The low pass filtering can be separated in two major contributors. For laser-based production of photomasks, the first contributor is the finite resolution of the aerial image of the light (if we limit this to laser-based imaging). The second contributor is the process consisting of development and etching.

Parameters of the physical model could be obtained theoretically, but normally due to complexity an empirical method is more practical, where a digital pattern description containing different linewidths and different surroundings is used to produce a photomask in the process for producing photomasks. Then, by measuring the linewidths on the mask and compare with convolved (lowpass filtered) digital pattern description, the parameters can be obtained.

If the physical model is derived in a preceding process using a specific machine and specific subsequent processes (e.g. development and etching) in the process for producing photomasks, the physical model will be in relation to that specific machine ad the specific subsequent processes and the resulting training data from the method 200 for generating training data will be particularly suited for training a convolutional neural network to derive corrected digital pattern descriptions for use in relation to that specific machine and the specific subsequent processes. However, as the same error sources will be present also in other machines of the same type and specific subsequent processes of the same types, the convolutional neural network trained on the training data generated based on the physical model derived for the specific machine and specific subsequent processes will also be useful to derive corrected digital pattern descriptions in relation to the other machines of the same type as the specific machine and other subsequent processes of the same types as the specific subsequent processes.

The method further comprises training S230 a reinforcement learning agent to derive corrected digital pattern descriptions from respective digital pattern descriptions. The training comprises, for each digital pattern description of the first plurality of digital pattern descriptions, the reinforcement learning agent iteratively updating a current candidate corrected digital pattern description based on a similarity between a predicted binary pattern of a photomask derived using the physical model and a desired binary pattern represented by the current candidate corrected digital pattern description and a desired binary pattern represented by the digital pattern description. The training further comprises updating the reinforcement learning agent. Thereby a trained reinforcement learning agent is generated.

Figure 6:
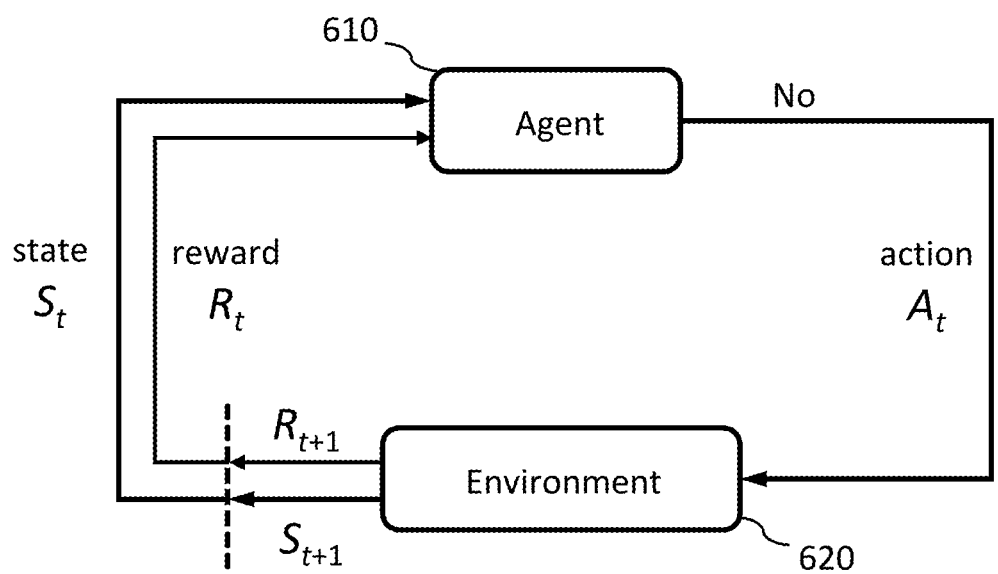
FIG. 6 shows a schematic diagram over a reinforcement learning framework used in methods of the present disclosure.

Turning to FIG. 6, a schematic diagram over a reinforcement learning framework 600 used in methods of the present disclosure is shown. Reinforcement learning is a set of techniques used to train a reinforcement learning agent, or simply an agent 610, so that it maximizes a reward R it gets from an environment 620. In alternative to maximizing a reward, minimizing a loss may equally be used. At each time step t (or iteration), the agent 610 receives an observation or state $S_t$ and the reward $R_t$ generated by its previous action $A_{t-1}$. Based on the observation or state $S_t$, the agent 610 will return a new action $A_t$. By taking actions and receiving rewards from the environment 620, the agent 610 can learn which actions are favorable in a given state. In training mode, the agent 610 will usually be allowed sub-optimal actions (sub-optimal considering the current experience of the agent 610) to test new solutions. That phase is called exploration phase. In production/inference mode, the agent 610 will focus on performing the optimal action which is called exploitation phase. The agent 610 can be a linear function approximator, a deep neural network, a convolutional neural network etc.

The agent 610 may determine which action $A_t$ to take at a time t using the Bellman equation:

$$V(S_t) = \max_{A_t}(R(S_t, A_t) + \gamma V(S_{t+1}))$$

The aim is to maximize the value V for the state $S_t$. The factor γ is a discount factor and determines how much the value V for the state $S_{t+1}$ should affect the value V for the state $S_t$. For a low discount factor γ the agent will typically select a short term optimal action $A_t$, whereas for a high discount factor γ the agent may select a short term sub-optimal action $A_t$ in order to achieve a long term optimal value for V.

The environment 620 has to be a Markov decision process for the Bellman equation to be solved using standard reinforcement techniques. Simplified this means that a next best move can be derived by only looking at the previous state, i.e. it is not necessary to know the full history the system to infer the best next move.

Turning back to FIG. 2 and referring also to the reference signs of FIG. 6, each digital pattern description of the first plurality descriptions is used in the training S230 of the reinforcement learning agent 610 sequentially. In the iterative updating, the updating of the current candidate corrected digital pattern at a time t is the action $A_t$. The action $A_t$ is based on a similarity between a predicted binary pattern of a photomask derived from the current candidate corrected digital pattern description using the physical model and a desired binary pattern represented by the digital pattern description. The similarity between the predicted binary pattern and the desired binary pattern at the time t is the state $S_t$. For example, a reward function $R(S_t, A_t)$ may be used that rewards high similarity between the predicted binary pattern and the desired binary pattern. The similarity between the predicted binary pattern and the desired binary pattern may be determined using one of an inverse L1 norm, an inverse L2 norm, inverse edge placement error, and inverse XOR. In each time t the reinforcement learning agent 610 will select an action $A_t$ aiming to maximize the value $V(S_t)$ in the Bellman equation. Once the action $A_t$ for the time t has been selected, the state $S_{t+1}$ and reward $R_{t-1}$ at a next time t+1 is determined based on the environment 620, i.e. a predicted binary pattern derived from the current candidate corrected digital pattern description after the action $A_t$ is determined and a similarity to the desired binary pattern is determined which will be $S_{t+1}$. If the reinforcement agent framework 600 is set up to solve the Bell equation with a low factor γ, actions in the form of updating of the current candidate corrected digital pattern will be performed with the aim of achieving a final corrected digital pattern that provides as high as possible similarity between the predicted binary pattern and the desired binary pattern. A long-term similarity between the predicted binary pattern and the desired binary pattern is thus prioritized.

Figure 7A:
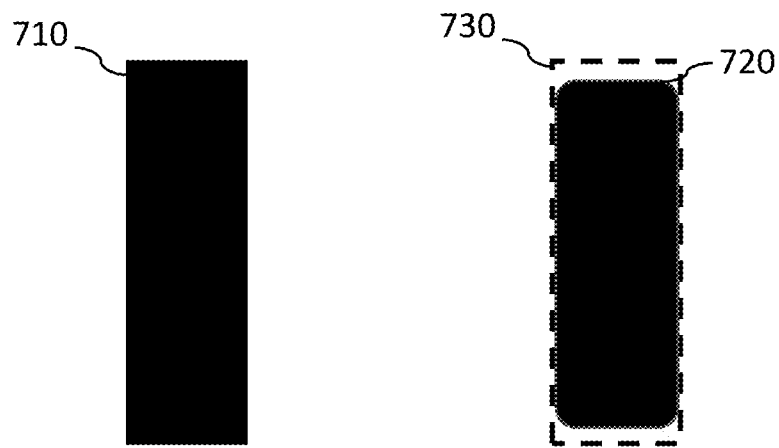
FIGS. 7a and 7b shows examples of a digital pattern description and a corrected pattern description and respective predicted binary patterns of photomasks.
Figure 7B:
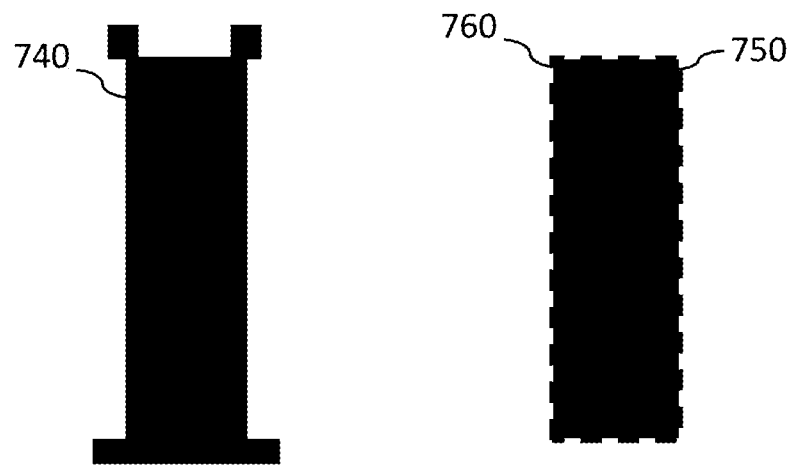

Turning to FIGS. 7a and 7b, FIG. 7a shows a simplified example of a digital pattern description 710 that may be input as one of the digital pattern descriptions of the first plurality of digital pattern descriptions in the training S230 of the reinforcement learning agent of the method 200 for generating training data for training a convolutional neural network. Also shown in FIG. 7a is then a predicted binary pattern 720 of a photomask produced in the process for producing photomasks as predicted using the physical model. In the example of FIG. 7a, the digital pattern description 710 directly represents the desired binary pattern. The predicted binary pattern 720 is shown in relation to a dashed line box 730 illustrating the desired binary pattern represented by the digital pattern description 710. As can be seen from FIG. 7a, the predicted binary pattern 720 differs from the desired binary pattern. FIG. 7b shows an example of a corrected digital pattern description 740 that may be the result of iterative updating of the digital pattern description

710 of FIG. 7*a* by the reinforcement learning agent after training in the method 200 for generating training data for training a convolutional neural network. Also shown in FIG. 7*b* is a predicted binary pattern 750 of a photomask produced in the process for producing photomasks as predicted using the physical model. The predicted binary pattern 750 is shown in relation to a dashed line box 760 illustrating the desired binary pattern represented by the digital pattern description 710 of FIG. 7*a*. As can be seen from FIGS. 7*a* and 7*b*, the predicted binary pattern 750 differs much less from the desired binary pattern than the predicted binary pattern 720.

The selection of which action $A_t$ to use in a current state $S_t$ can be based deep Q-learning. This works well since the environment is relatively simple, since for a given action, i.e. given updating of the current candidate corrected digital pattern, the similarity of the predicted binary pattern and the desired binary pattern is relatively simple to determine. However, the number of states and actions is very large. A Q-value is the value of $V(S_t)$ for a given pair of state $S_t$ and action $A_t$. In deep Q-learning a neural network is used. The state $S_t$ is input to the neural network which then outputs Q-values relating to a set of possible actions. The Q-values are the used to select which $A_t$ to use. See further https://arxiv.org/pdf/1912.07190.pdf and https://www.mlq.ai/deep-reinforcement-learning-q-learning/The type of updating of the current candidate corrected digital pattern description performed in each iteration will depend on the type of the digital pattern description to be corrected. If the digital binary pattern description to be corrected is rasterized and defined as a grid of pixels, wherein each pixel has respective binary value, the agent 610 can perform actions in the form of changes on the current candidate corrected digital pattern description for each pixel independently. The most basic types of actions are "change value of the pixel", which corresponds to adding +1 if the value is 0 or adding −1 if the value is 1, and "do not change value of the pixel", which corresponds to adding 0. Other types of actions are anticipated, such as "add a 3×3 square centered on this pixel", "remove a 11×11 square with this pixel as the upper right pixel" etc. If the digital pattern description to be corrected is rasterized and defined as a grid of pixels, wherein each pixel has respective value that is not necessarily binary but may be anything between 0 and 1, e.g. describing a fraction of a pixel, the actions can be "change the value of this pixel", which may correspond to add a positive or negative value such that a new value between 0 and 1 for the pixel, or and "leave the value of this pixel as it is", which corresponds to adding 0. If the digital pattern description to be corrected is a direct description of the desired binary pattern, the actions may be any type of action that changes the digital pattern description.

The iterative updating of the current candidate corrected digital pattern description is repeated until the end of an episode is reached. The end of an episode may be after N steps of updating, or until a candidate corrected digital pattern description fulfils a criterion, e.g. set on the similarity between the predicted binary pattern and the desired binary pattern. After this the agent is updated with everything that was tested during the episode. The iterative updating is the repeated for another digital pattern description of the first plurality of digital pattern descriptions. To stabilize the training, multiple episodes may be accumulated before updating the agent.

During exploration, i.e. during the training S230 of the reinforcement learning agent 610, the reinforcement learning agent 610 will perform actions (e.g. one action per pixel) to iteratively update the current candidate corrected digital pattern description. For instance, if an episode (one digital pattern description of the first plurality of digital pattern descriptions updated until a terminal state is reached) is set to last 124 iterations, the agent will receive a current candidate corrected digital pattern description 124 times (the original digital pattern description at the first iteration) and update it 124 times, e.g. by updating each pixel 124 times. If on the other hand the episode is set to last until a criterion is met for the similarity between the predicted binary pattern and the desired binary pattern for the current candidate corrected digital pattern description, at the end of each iteration, a similarity value (scalar) is computed. If the similarity value is above a threshold, the episode is ended, i.e. the current candidate corrected digital pattern results in a predicted binary pattern that is similar enough to the desired binary pattern. Otherwise the iteration is continued. Setting a criterion based on similarity is preferably combined with a limit on the number of iterations for an episode in order to avoid that the episode never stops.

The reinforcement learning agent may be a convolutional neural network. Any image-to-image networks. For instance: 'UNet-like", Linknet, PSPNet and FPN (https://github.com/qubvel/segmentation_models)

The method further comprises generating S240 a second plurality of digital pattern descriptions representative of desired binary patterns of photomasks to be produced using the process for producing photomasks.

By representative is meant that the desired binary patterns represented by the second plurality of digital pattern descriptions are at least of a same general type as the desired binary patterns of photomasks to be produced in the process for producing photomasks.

It is to be noted that the second plurality of digital pattern descriptions need not include digital pattern descriptions corresponding to complete desired binary patterns of photomasks to be produced using the process for producing photomasks. Instead, the second plurality of digital pattern descriptions may be representative of desired binary patterns in that it includes digital pattern descriptions representing portions (crops) of desired binary patterns of photomasks to be produced using the process for producing photomasks.

Each digital pattern description of the second plurality of digital pattern descriptions may be randomly generated. For example, the random generation of a digital pattern description may comprise randomly adding and/or removing elements starting from an initial empty digital pattern description or seed digital pattern description. The type of elements added and/or removed will depend on the type of elements included digital pattern descriptions representative of desired binary patterns of photomasks to be produced using the process for producing photomasks. For example, the elements may be rectangles. In such a case, rectangles of random shape, position and orientation are added and/or removed, e.g. over a predetermined number of iterations.

Generating the second plurality of digital pattern descriptions randomly is a simple way of generating a very large number of varying digital pattern descriptions can be generated.

Training data are then generated S250 by, for each digital pattern description of the second plurality of digital pattern descriptions, derive a corresponding corrected digital pattern description using the trained reinforcement learning agent. Deriving the corresponding corrected digital pattern description using the trained reinforcement learning agent uses a similar iterative process for each digital pattern description of the second plurality of digital pattern description except from there not being any updating of the reinforcement learning agent 610 as this relates to an exploitation phase of the reinforcement learning.

The training data is then comprised of the second plurality of digital pattern descriptions and the corresponding corrected digital pattern descriptions.

By first training the reinforcement learning agent based on a generated first plurality of digital pattern descriptions and a given physical model, and then producing a second plurality of digital pattern descriptions and generate the training data using the trained reinforcement learning agent, training data including a very large number of digital pattern description and corrected digital pattern description pairs may be produced without the need of actually producing any photomasks. The photomasks that need to be produced are the ones needed for the preceding deriving of the physical model.

The processes of generating the first and second plurality of digital pattern descriptions may be evaluated based on comparison of the method of producing training data in relation to real data. This may be done by producing photomasks in the process for producing photomasks based on corrected digital pattern descriptions from the method of producing training data and comparing to the corresponding desired digital pattern descriptions. If the method underperforms in terms of corruptions in relation to specific features of the digital pattern descriptions, the first and second plurality of digital pattern descriptions may then be adapted by adding further digital pattern descriptions having such features in order to train the reinforcement agent based on the adapted first and second plurality of digital pattern descriptions.

Figure 3:
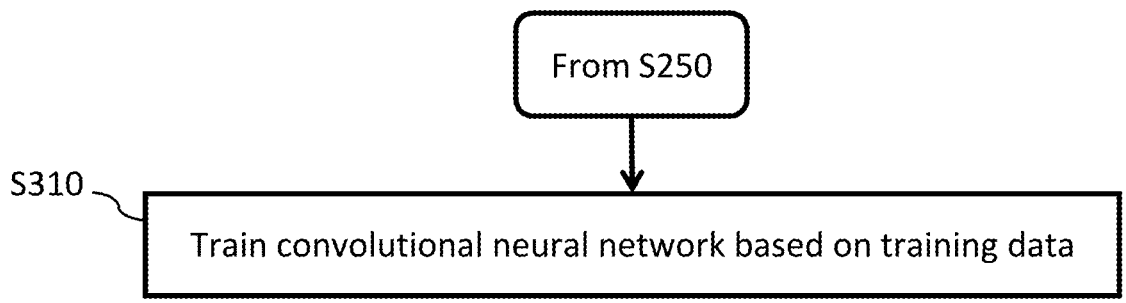
FIG. 3 shows a flow chart of a further method according to the present disclosure.

FIG. 3 shows a flow chart of a method 300 for generating a trained convolutional neural network for deriving corrected digital pattern descriptions from digital pattern descriptions for use in a process for producing photomasks having binary patterns according to the digital pattern descriptions. The method comprises generating training data according to the method described in relation to FIG. 2, and training S310 the convolutional neural network for deriving corrected digital binary pattern descriptions from digital binary pattern descriptions, wherein the training uses supervised learning based on the training data, thereby generating the trained convolutional network.

The convolutional neural network that is trained to derive corrected digital pattern descriptions may be a UNet or similar image-to-image convolutional neural network. Any other convolutional neural network suitable to use in this kind of application, namely image transforms, may also be used.

The corrected digital pattern descriptions may each be a rasterized description including a grid of pixels wherein each pixel has a respective value indicating to which degree the pixel should be covered by the binary pattern.

Figure 4:
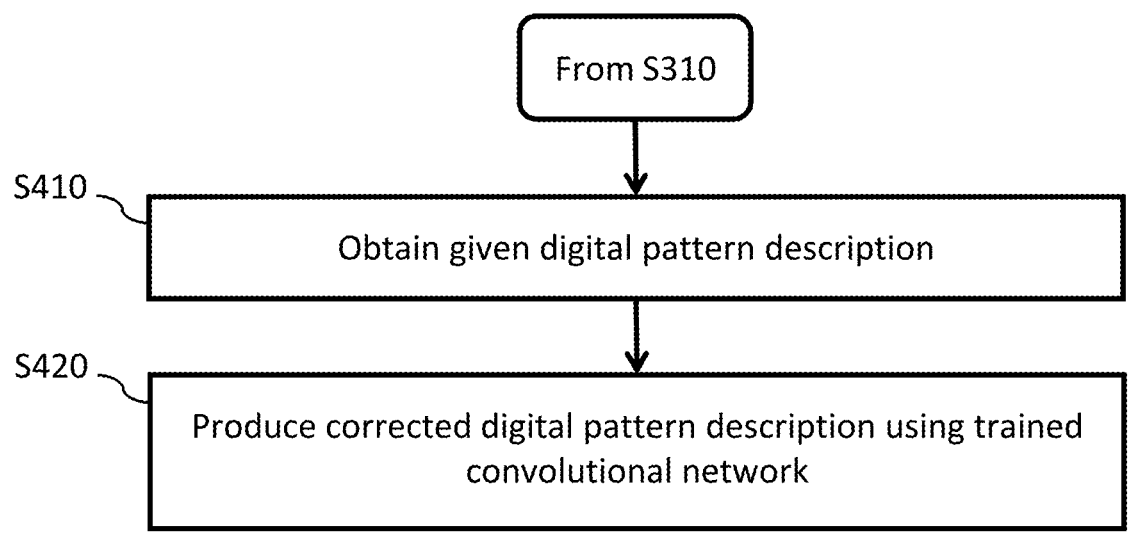
FIG. 4 shows a flow chart of yet a further method according to the present disclosure.

FIG. 4 shows a flow chart of a method 400 for deriving a corrected digital pattern description from a given digital pattern description for use in a process for producing a photomask having a binary pattern according to the given digital pattern description. The method comprises generating a trained convolutional neural network according to the method described in relation to FIG. 3, obtaining S410 the given digital pattern description, and deriving S420 a corrected digital pattern description from the given digital binary pattern description using the trained convolutional neural network.

The given digital pattern description and the corrected digital pattern description may each be a rasterized description including a grid of pixels wherein each pixel has a respective value indicating to which degree the pixel should be covered by the binary pattern.

Deriving the corrected digital pattern description may comprise deriving a preliminary corrected digital pattern description from the given digital pattern description using the trained convolutional neural network, and deriving the corrected digital pattern description from the given digital pattern description using the trained reinforcement learning agent based on the preliminary corrected digital pattern description. Hence, the trained reinforcement learning agent used to produce the training data for training the convolutional neural network may be further used to enhance the resulting corrected digital pattern description of the trained convolutional neural network.

Figure 5:
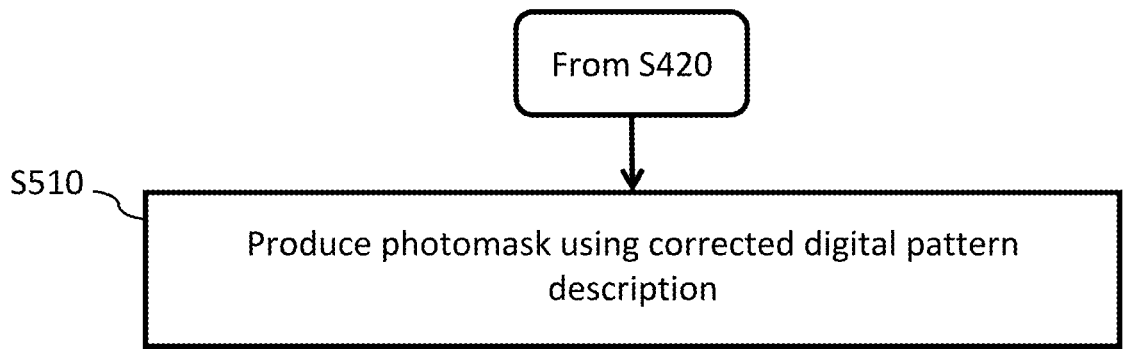
FIG. 5 shows a flow chart of yet a further method according to the present disclosure.

FIG. 5 shows a flow chart of a method 500 for producing a photomask according to a given digital pattern description. The method comprises deriving a corrected digital pattern description according to the method described in relation to FIG. 4 and producing S510 the photomask using the corrected digital pattern description. By using the corrected pattern description, the resulting photomask will have a binary pattern that is similar to the desired binary pattern represented by the given digital pattern description from which the corrected digital pattern description was derived. The given digital pattern description and the corrected digital pattern description may each be a rasterized description including a grid of pixels wherein each pixel has a respective value indicating to which degree the pixel should be covered by the binary pattern. For a process for producing photomasks using exposure of a radiation sensitive surface by means of a radiation beam, the value may represent an intensity of the radiation beam in relation to the pixel.

Turning to FIGS. 7*a* and 7*b*, FIG. 7*a* shows a simplified example of a digital pattern description 710 that may be input to a process for producing photomasks. Also shown in FIG. 7*a* is then a resulting binary pattern 720 of a photomask produced in the process for producing photomasks. In the example of FIG. 7*a*, the digital pattern description 710 directly represents the desired binary pattern. The resulting binary pattern 720 is shown in relation to a dashed line box 730 illustrating the desired binary pattern represented by the digital pattern description 710. As can be seen from FIG. 7*a*, the predicted binary pattern 720 differs from the desired binary pattern. FIG. 7*b* shows an example of a corrected digital pattern description 740 that may be the result from the method 400 for deriving a corrected digital pattern description from the digital pattern description 710 of FIG. 7*a*. Also shown in FIG. 7*b* is then a resulting binary pattern 750 of a photomask produced in the process for producing photomasks based on the corrected digital pattern description 740. The resulting binary pattern 750 is shown in relation to a dashed line box 760 illustrating the desired binary pattern represented by the digital pattern description 710 of FIG. 7*a*. As can be seen from FIGS. 7*a* and 7*b*, the resulting binary pattern 750 differs much less from the desired binary pattern than the predicted binary pattern 720.

Figure 8:
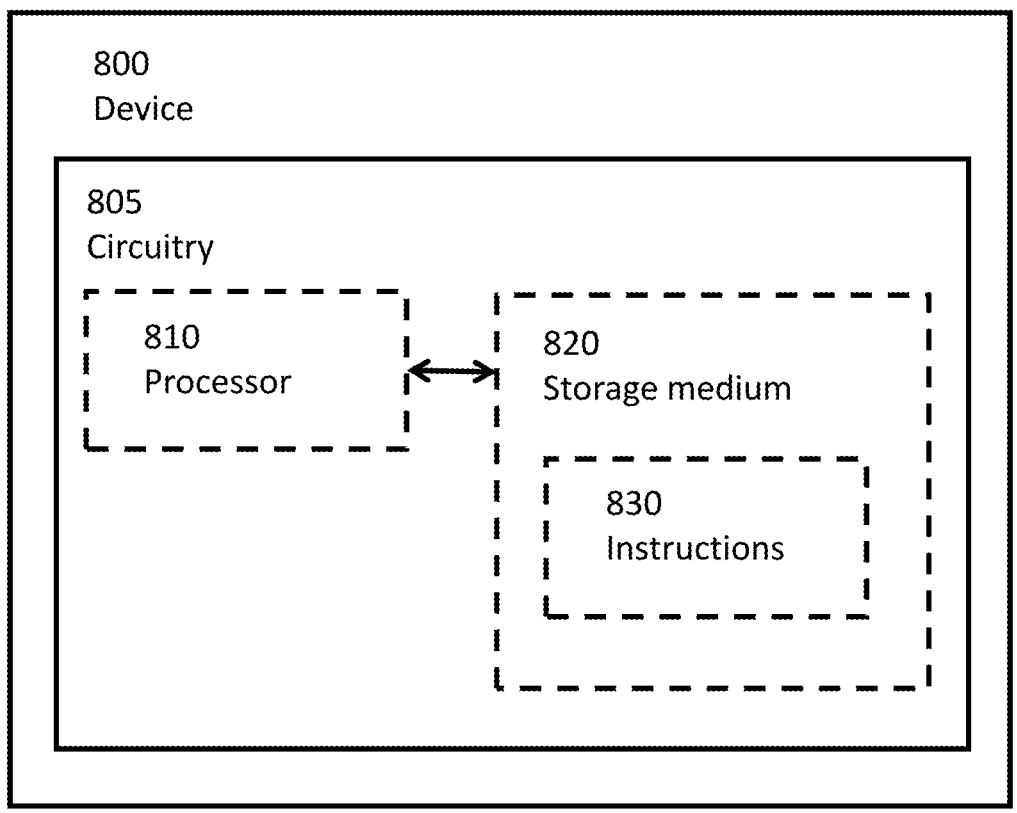
FIG. 8 shows a schematic diagram of devices according to the present disclosure.

FIG. 8 shows a schematic diagram of a device 800 according to the present disclosure. The device 800 comprises circuitry 805 configured to perform a method according to the present disclosure. The circuitry 805 may for example comprise a processor 810, and a non-transitory computer-readable storage medium 820, e.g. in the form of a memory, wherein the non-transitory computer-readable storage medium comprises computer-readable instructions 830 that, when executed on the device 800, e.g. on the processor 810, cause the device 800 to perform a method according to the present disclosure. The computer-readable instructions 830 may be included in a computer program.

In an embodiment, the device 800 is configured for generating training data for training a convolutional neural network for deriving corrected digital binary pattern descriptions from digital binary pattern descriptions for use in a process for producing photomasks having binary patterns according to the digital binary pattern descriptions. The circuitry 805 is then configured to generate training data according to the method described in relation to FIG. 2.

In another embodiment, the device 800 is configured for generating a trained convolutional neural network for deriving corrected digital binary pattern descriptions from digital binary pattern descriptions for use in a process for producing photomasks having binary patterns according to the digital binary pattern descriptions. The circuitry 805 is then configured to generate a trained convolutional neural network according to the method described in relation to FIG. 3.

In another embodiment, the device 800 is configured for deriving a corrected digital binary pattern description from a given digital binary pattern description for use in a process for producing a photomask having a binary pattern according to the given digital binary pattern description. The circuitry 805 is then configured to derive a corrected digital binary pattern description according to the method described in relation to FIG. 4.

Figure 9:
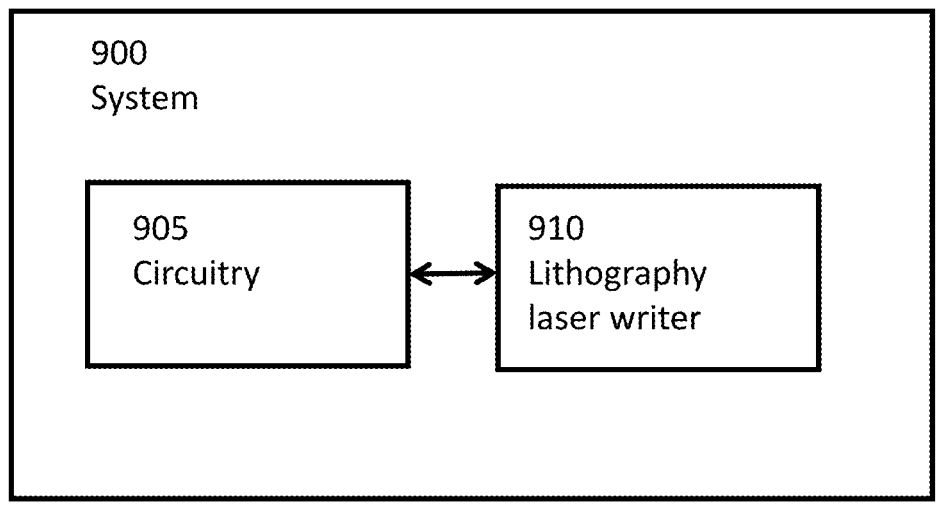
FIG. 9 shows an illustration of shows a schematic diagram of a system according to the present disclosure.

FIG. 9 shows a schematic diagram of a system 900 for writing photomasks. The system 900 comprises circuitry 905 configured to derive a corrected digital pattern description according to the method described in relation to FIG. 4, and a lithographic laser writer 910 for writing the photomask on a radiation sensitive surface using the corrected digital pattern description.

In an embodiment, the circuitry 905 comprises the device 800 configured for deriving a corrected digital binary pattern description from a given digital binary pattern description for use in a process for producing a photomask having a binary pattern according to the given digital binary pattern description.

The above description of examples is to be regarded as non-limiting. While specific examples have been described, it will be apparent to those having ordinary skill within the art that various changes, modifications or alterations are conceivable within the scope as defined in the appended claims.

EMBODIMENT LIST

1. A method for generating training data for training a convolutional neural network for deriving corrected digital pattern descriptions from digital pattern descriptions, each digital pattern description represents a respective desired pattern of a photomask to be produced in a process for producing photomasks according to digital pattern descriptions, the method comprising:
    generating a first plurality of digital pattern descriptions representing desired binary patterns representative of desired binary patterns of photomasks to be produced in the process for producing photomasks;
    obtaining a physical model using which a predicted binary pattern of a photomasks can be derived from a given digital pattern description, wherein the predicted binary pattern is a prediction of a binary pattern that would result from inputting the given digital pattern description to the process for producing photomasks;
    training a reinforcement learning agent to derive corrected digital pattern descriptions from respective digital pattern descriptions, the training comprising, for each digital pattern description of the first plurality of digital pattern descriptions, the reinforcement learning agent iteratively updating a current candidate corrected digital pattern description based on a similarity between a predicted binary pattern of a photomask derived from the current candidate corrected digital pattern description using the physical model and a desired binary pattern represented by the digital pattern description, and updating the reinforcement learning agent, thereby generating a trained reinforcement learning agent;
    generating a second plurality of digital pattern descriptions representative of desired binary patterns of photomasks to be produced in the process for producing photomasks; and
    for each digital pattern description of the second plurality of digital pattern descriptions, deriving a corresponding corrected digital pattern description using the trained reinforcement learning agent, thereby generating training data.

2. The method according to embodiment 1, wherein the reinforcement learning agent is arranged to iteratively update the current candidate corrected digital pattern description in such a way that a long term similarity between the predicted binary pattern and the desired binary pattern is prioritized.

3. The method according to embodiment 1, wherein the similarity between the predicted binary pattern and the desired binary pattern is determined using at least one of an inverse L1 norm, an inverse L2 norm, inverse edge placement error, and inverse XOR.

4. The method according to embodiment 1, wherein each digital pattern description and corrected digital pattern description is defined as a grid of pixels, wherein each pixel has a respective value.

5. The method according to embodiment 4, wherein the reinforcement learning agent is arranged to iteratively update the current candidate corrected digital pattern description by, for each pixel of the current candidate corrected digital pattern description, either changing or not changing a value of the pixel.

6. The method according to embodiment 1, wherein each digital pattern description of the first plurality of digital pattern descriptions and the second plurality of digital pattern descriptions is randomly generated.

7. The method according to embodiment 1, wherein the reinforcement learning agent is a convolutional neural network.

8. A method for generating a trained convolutional neural network for deriving corrected digital pattern descriptions from digital pattern descriptions for use in a process for producing photomasks according to digital pattern descriptions, comprising:
    generating training data according to the method of embodiment 1; and training the convolutional neural network for deriving corrected digital binary pattern descriptions from digital binary pattern descriptions, wherein the training uses supervised learning based on the training data, thereby generating the trained convolutional network.

9. A method for deriving a corrected digital pattern description from a given digital pattern description for use in a process for producing a photomask having a binary pattern according to the given digital pattern description, the method comprising:
    generating a trained convolutional neural network according to the method of embodiment 8;
    obtaining the given digital pattern description; and
    deriving a corrected digital pattern description from the given digital binary pattern description using the trained convolutional neural network.

10. The method according to claim 9, wherein deriving the corrected digital pattern description comprises:
deriving a preliminary corrected digital pattern description from the given digital pattern description using the trained convolutional neural network; and
deriving the corrected digital pattern description from the given digital pattern description using the trained reinforcement learning agent based on the preliminary corrected digital pattern description.

11. A method for producing a photomask according to a given digital pattern description, the method comprising:
deriving a corrected digital pattern description according to the method of embodiment 9; and
producing the photomask using the corrected digital pattern description.

12. A non-transitory computer-readable storage medium comprising instructions which, when executed by a device having processing capability, causes the device to carry out the method of claim 1.

13. A device for generating training data for training a convolutional neural network for deriving corrected digital binary pattern descriptions from digital binary pattern descriptions, each digital pattern description representing a respective desired pattern of a photomask to be produced in a process for producing photomasks according to the digital pattern descriptions, the device comprising circuitry configured to generate training data according to the method of embodiment 1.

14. A device for generating a trained convolutional neural network for deriving corrected digital binary pattern descriptions from digital binary pattern descriptions for use in a process for producing photomasks according to digital binary pattern description, the device comprising circuitry configured to generate a trained convolutional neural network according to the method of embodiment 8.

15. A device for deriving a corrected digital binary pattern description from a given digital binary pattern description for use in a process for producing a photomask having a binary pattern according to the given digital binary pattern description, the device comprising circuitry configured to derive a corrected digital pattern description according to the method of embodiment 9.

16. A system for writing a photomask, the system comprising:
circuitry configured to derive a corrected digital pattern description according to the method of embodiment 9; and
a lithographic laser writer for writing a photomask on a radiation sensitive surface using the corrected digital pattern description.

The invention claimed is:

1. A method comprising:
generating a first plurality of digital pattern descriptions representing desired binary patterns representative of desired binary patterns of photomasks to be produced in a process for producing photomasks according to digital pattern descriptions;
obtaining a physical model using which a predicted binary pattern of a photomask can be derived from a given digital pattern description, wherein the predicted binary pattern is a prediction of a binary pattern that would result from inputting the given digital pattern description to the process for producing photomasks;
training a reinforcement learning agent to derive corrected digital pattern descriptions from respective digital pattern descriptions, the training comprising, for each digital pattern description of the first plurality of digital pattern descriptions, the reinforcement learning agent iteratively updating a current candidate corrected digital pattern description based on a similarity between a predicted binary pattern of a photomask derived from the current candidate corrected digital pattern description using the physical model and a desired binary pattern represented by the digital pattern description, and updating the reinforcement learning agent, thereby generating a trained reinforcement learning agent, wherein the reinforcement learning agent is arranged to iteratively update the current candidate corrected digital pattern description in such a way that a long term similarity between the predicted binary pattern and the desired binary pattern is prioritized;
generating a second plurality of digital pattern descriptions representative of desired binary patterns of photomasks to be produced in the process for producing photomasks; and
for each digital pattern description of the second plurality of digital pattern descriptions, deriving a corresponding corrected digital pattern description using the trained reinforcement learning agent, thereby generating training data for training a convolutional neural network for deriving corrected digital pattern descriptions from digital pattern descriptions.

2. The method according to claim 1, wherein the similarity between the predicted binary pattern and the desired binary pattern is determined using at least one of an inverse L1 norm, an inverse L2 norm, inverse edge placement error, and inverse XOR.

3. The method according to claim 1, wherein each digital pattern description and corrected digital pattern description is defined as a grid of pixels, wherein each pixel has a respective value.

4. The method according to claim 3, wherein the reinforcement learning agent is arranged to iteratively update the current candidate corrected digital pattern description by, for each pixel of the current candidate corrected digital pattern description, either changing or not changing a value of the pixel.

5. The method according to claim 1, wherein each digital pattern description of the first plurality of digital pattern descriptions and the second plurality of digital pattern descriptions is randomly generated.

6. The method according to claim 1, wherein the reinforcement learning agent is a convolutional neural network.

7. The method of claim 1, further comprising:
training the convolutional neural network for deriving corrected digital binary pattern descriptions from digital binary pattern descriptions for use in the process for producing photomasks according to digital pattern descriptions, wherein the training uses supervised learning based on the training data, thereby generating the trained convolutional network.

8. The method of claim 7, further comprising:
obtaining a given digital pattern description for use in a process for producing a photomask having a binary pattern according to the given digital pattern description; and
deriving a corrected digital pattern description from the given digital binary pattern description using the trained convolutional neural network.

9. The method according to claim 8, wherein deriving the corrected digital pattern description comprises:
deriving a preliminary corrected digital pattern description from the given digital pattern description using the trained convolutional neural network; and deriving the corrected digital pattern description from the given digital pattern description using the trained reinforcement learning agent based on the preliminary corrected digital pattern description.

10. The method of claim 8 further comprising:
producing the photomask using the corrected digital pattern description.

11. A non-transitory computer-readable storage medium comprising instructions which, when executed by a device having processing capability, causes the device to carry out the method of claim 1.

12. A system for writing a photomask, the system comprising:
   circuitry configured to derive a corrected digital pattern description according to the method of claim 8; and
   a lithographic laser writer for writing a photomask on a radiation sensitive surface using the corrected digital pattern description.

* * * * *